(12) United States Patent
Leng

(10) Patent No.: US 6,346,034 B1
(45) Date of Patent: Feb. 12, 2002

(54) CUTTING METHOD

(75) Inventor: Xue-Qing Leng, Tokyo (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 09/655,722

(22) Filed: Sep. 5, 2000

(30) Foreign Application Priority Data

Sep. 8, 1999 (JP) .......................................... 11-254472

(51) Int. Cl.$^7$ .............................. B24B 9/06; B28D 1/24
(52) U.S. Cl. ........................................ 451/58; 125/13.01
(58) Field of Search .......................... 125/23.01, 13.01; 451/58, 57, 41

(56) References Cited

U.S. PATENT DOCUMENTS 4,688,540 A * 8/1987 Ono ........................ 125/13.01
5,266,528 A * 11/1993 Yamada ...................... 437/226
5,462,900 A * 10/1995 Oki et al. .................... 437/249

* cited by examiner

*Primary Examiner*—Robert A. Rose
(74) *Attorney, Agent, or Firm*—Smith, Gambrell & Russel, LLP

(57) ABSTRACT

A cutting method of cutting a workpiece by moving the workpiece relatively to a cutting blade that has an annular cutting edge and rotates in a predetermined direction, the workpiece being moved in a direction at right angles to the rotary shaft of the cutting blade, wherein the cutting method comprises a cutting step of cutting the workpiece by moving the workpiece in a forward direction in respect to the rotational direction of the cutting blade at a position where the blade and the workpiece face each other, and a burr-trimming step for tracing the groove cut by the cutting step by moving the workpiece in a direction against the rotational direction of the cutting blade at a position where the blade and the workpiece face each other.

6 Claims, 7 Drawing Sheets

CUTTING METHOD

FIELD OF THE INVENTION

The present invention relates to a method of cutting a workpiece by using a cutting blade having an annular cutting edge.

DESCRIPTION OF THE PRIOR ART

In the production of semiconductor devices, for example, a surface of a nearly disk-like semiconductor wafer is sectioned into a plurality of rectangular sections by the cutting lines called streets that are arranged in a form of a lattice pattern, and a predetermined circuit pattern is formed on each of these rectangular sections. The plural rectangular sections on which the circuit pattern is formed are cut into individual pieces to form so-called semiconductor chips. The cutting of the semiconductor wafer is usually carried out by using a precision cutting machine called dicing machine. The dicing machine is equipped with a cutting blade having an annular cutting edge. The workpiece is moved relatively to the cutting blade in a direction at right angles to the rotary shaft of the cutting blade to execute the cutting.

On the semiconductor wafer is formed laminated circuit wiring. The wiring is generally formed of aluminum. In recent years, however, study has been forwarded to put a copper foil into a practical use. That is, copper has an electrical resistivity as small as 1.7 $\mu\Omega$-cm which is about one-half the electrical resistivity of aluminum, and consequently, makes it possible to realize a wiring of a width of 0.15 $\mu$m to cope with a high degree of integration as well as to increase the speed of critical path by at least 30%. Besides, wiring of copper can be produced at a lower cost compared with that of aluminum and hence, copper is drawing attention as a wiring material to substitute for aluminum.

When the semiconductor wafer on which the copper foil is laminated is cut by using the dicing machine, plural whisker-like burrs of lengths of about 20 to 50 $\mu$m are formed on both sides of a groove that has been formed by cutting. These burrs could cause troubles such as a short-circuit among the laminated layers and among the bondings or injury. Besides, burrs that have come off could cause damage to the circuits. It is considered that the burrs are formed since copper is soft and viscous and is likely to be easily deformed.

SUMMARY OF THE INVENTION

It is an object of the present invention to provide a cutting method which does not produce burrs at the time of cutting a workpiece on which is laminated a metal foil which is soft, viscous and likely to be easily deformed, such as copper, gold or silver, and particularly at the time of cutting a semiconductor wafer on which the metal foil is laminated as a wiring of an integrated circuit.

In order to accomplish the above-mentioned object according to the present invention, there is provided a cutting method of cutting a workpiece by moving the workpiece relatively to a cutting blade that has an annular cutting edge and rotates in a predetermined direction, the workpiece being moved in a direction at right angles to the rotary shaft of the cutting blade, wherein the cutting method comprises:

a cutting step of cutting the workpiece by moving the workpiece in a forward direction in respect to the rotational direction of the cutting blade at a position where the blade and the workpiece face each other; and a burr-trimming step for tracing the groove cut by the cutting step by moving the workpiece in a direction against the rotational direction of the cutting blade at a position where the blade and the workpiece face each other.

The invention further provides a cutting method by successively executing the cutting step and the burrtrimming step by reciprocatingly moving the workpiece relative to the cutting blade that rotates in the predetermined direction, feeding the cutting blade for indexing a cutting line that is to be cut next, and executing the cutting step and the burr-trimming step by reciprocatingly moving the workpiece.

It is desirable that a relative moving speed between the cutting blade and the workpiece in the burr-trimming step is set to be greater than a relative moving speed between the cutting blade and the workpiece in the cutting step.

DETAILED DESCRIPTION OF THE PREFERRED EMBODIMENTS

An embodiment of the cutting method according to the present invention will now be described in detail with reference to the accompanying drawings.

Figure 1:
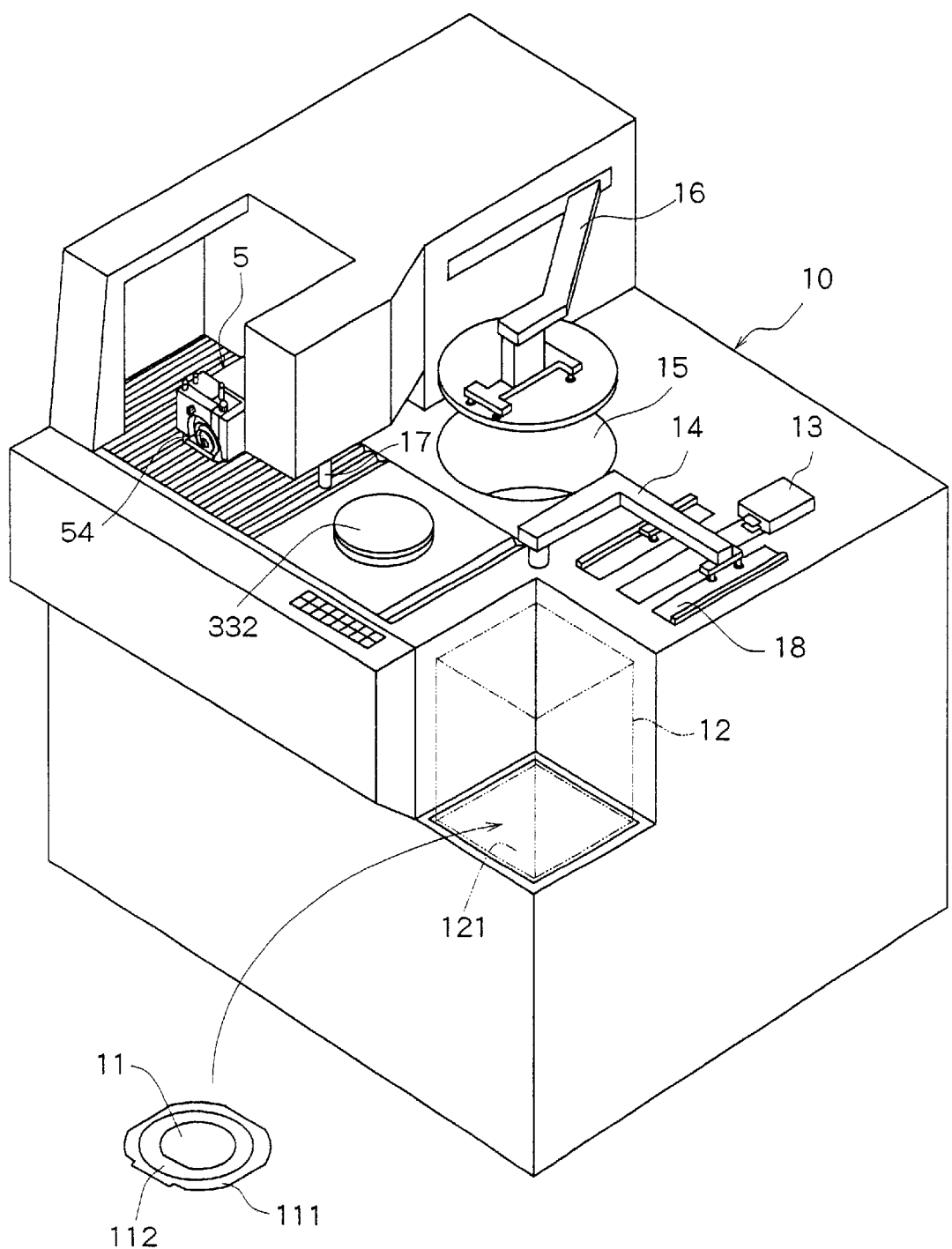
FIG. 1 is a perspective view of a dicing machine which is a cutting machine used for performing the cutting method of the present invention.

FIG. 1 is a perspective view of a dicing machine which is the cutting machine for putting the cutting method of the present invention into practice.

Figure 2:
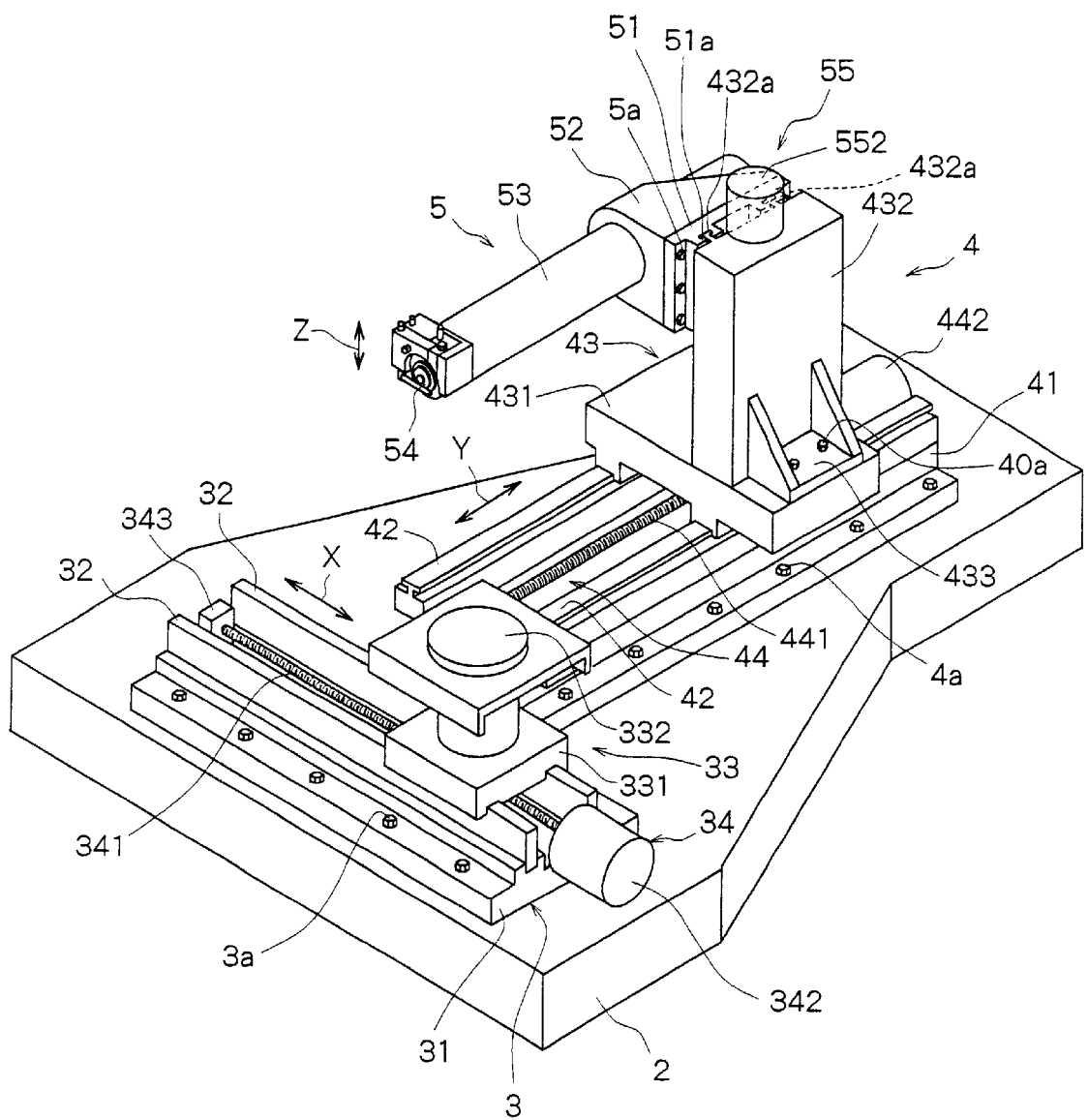
FIG. 2 is a perspective view illustrating major portions of the dicing machine shown in FIG. 1.

The dicing machine shown in FIG. 1 is equipped with a housing 10 of nearly a rectangular parallelepiped shape. The housing 10 contains a stationary base plate 2 shown in FIG. 2, a chuck table mechanism 3 that is disposed on the stationary base plate 2 to freely move in a direction indicated by an arrow X which is the feeding direction and holds the workpiece, a spindle support mechanism 4 disposed on the stationary base plate 2 to freely move in a direction indicated by an arrow Y (direction perpendicular to the direction indicated by the arrow X which is the feeding direction) which is the indexing direction, and a spindle unit 5 disposed on the spindle support mechanism 4 to freely move in a direction indicated by an arrow Z which is the cutting-in direction.

The chuck table mechanism 3 includes a support plate 31 disposed on the stationary base plate 2 and secured thereto with plural mounting bolts 3a, two guide rails 32 and 32 arranged on the support plate 31 in parallel with each other along the direction indicated by the arrow X, and a chuck table 33 disposed on the guide rails 32 and 32 so as to move in a direction indicated by the arrow X. The chuck table 33 includes an adsorption chuck support plate 331 movably disposed on the guide rails 32 and 32, and an adsorption chuck 332 mounted on the adsorption chuck support plate 331, and holds the workpiece such as a disk-like semiconductor wafer on the adsorption chuck 332 by a suction means that is not shown. The chuck table mechanism 3 includes a drive means 34 for moving the chuck table 33 along the two guide rails 32 and 32 in the direction indicated by the arrow X. The drive means 34 includes an externally threaded rod 341 disposed between the two guide rails 32 and 32 in parallel therewith, and a drive source such as pulse motor 342 for rotatively driving the externally threaded rod 341. The externally threaded rod 341 is rotatably supported, at its one end, by a bearing block 343 that is secured to the support plate 31 and is transmission-coupled, at its other end, to the output shaft of the pulse motor 342 through a reduction gear that is not shown. The externally threaded rod 341 is screwed into an internally threaded through-hole formed in an internally threaded block (not shown) that protrudes from the lower surface at the center of the adsorption chuck support plate 331 that constitutes the chuck table 33. By driving the externally threaded rod 341 forward and reverse by the pulse motor 342, therefore, the chuck table 33 is moved along the guide rails 32 and 32 in the direction indicated by the arrow X. The chuck table mechanism 3 further has a turning mechanism (not shown) for turning the chuck table 33.

The spindle support mechanism 4 includes a support plate 41 disposed on the stationary base plate 2 and secured thereto with plural mounting bolts 4a, two guide rails 42 and 42 arranged on the support plate 41 in parallel with each other along the direction indicated by the arrow Y, and a movable support plate 43 disposed on the guide rails 42 and 42 so as to move in a direction indicated by the arrow Y. The movable support plate 43 includes a moving support portion 431 movably disposed on the guide rails 42 and 42, and a spindle-mounting portion 432 mounted on the moving support portion 431. A mounting bracket 433 is secured to the spindle-mounting portion 432. By fastening the mounting bracket 433 to the moving support portion 431 with plural mounting bolts 40a, the spindle-mounting portion 432 is mounted on the moving support portion 431. The spindle-mounting portion 432 further has two guide rails 432a, 432a extending in the direction indicated by the arrow Z on the surface opposite to the surface on which the mounting bracket 433 is mounted. The spindle support mechanism 4 includes a drive means 44 for moving the movable support plate 43 along the two guide rails 42 and 42 in the direction indicated by the arrow Y. The drive means 44 includes an externally threaded rod 441 disposed between the two guide rails 42 and 42 in parallel therewith, and a drive source such as pulse motor 442 for rotatively driving the externally threaded rod 441. The externally threaded rod 441 is rotatably supported, at its one end, by a bearing block (not shown) that is secured to the support plate 41 and is transmission-coupled, at its other end, to the output shaft of the pulse motor 442 through a reduction gear that is not shown. The externally threaded rod 441 is screwed into an internally threaded through-hole formed in an internally threaded block (not shown) that protrudes from the lower surface at the center of the moving support portion 431 constituting the movable support plate 43. By driving the externally threaded rod 441 forward and reverse by the pulse motor 442, therefore, the movable support plate 43 is moved along the guide rails 42 and 42 in the direction indicated by the arrow Y.

Figure 3:
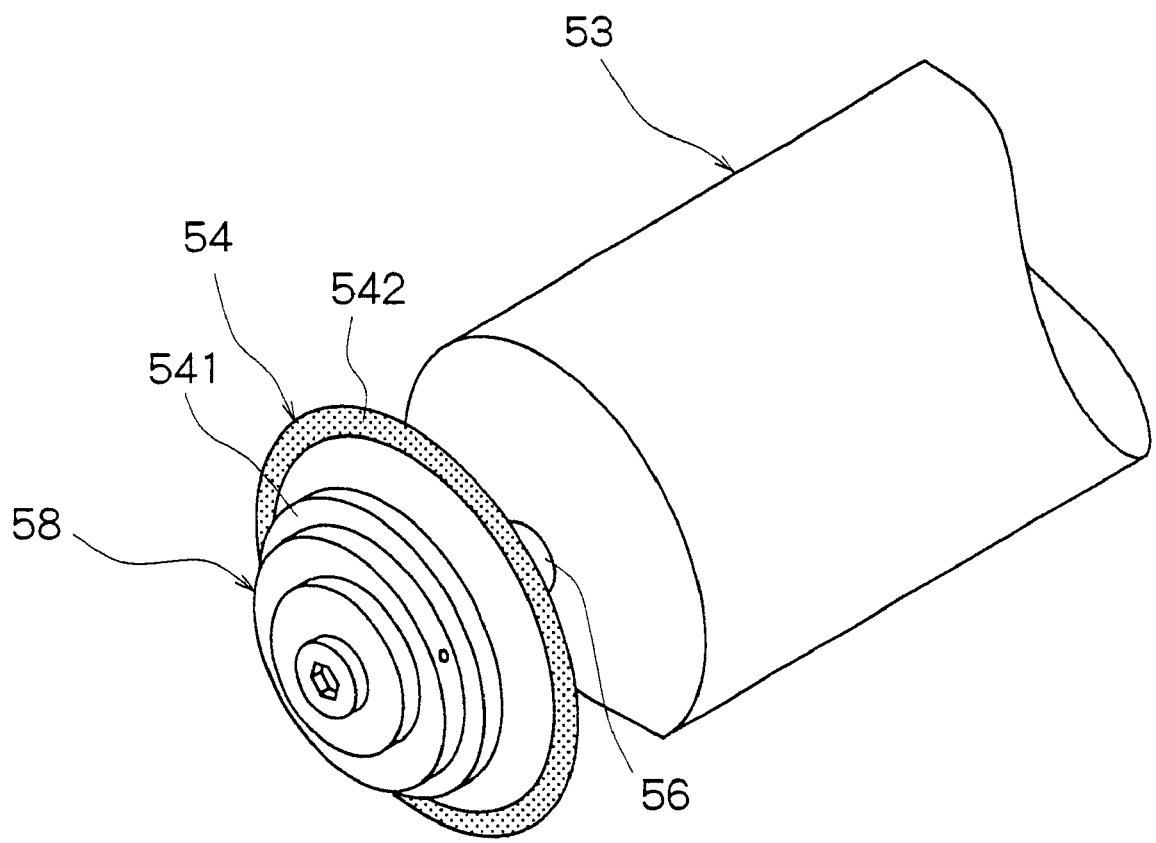
FIG. 3 is a perspective view illustrating major portions of a spindle unit that constitutes the dicing machine shown in FIG. 2.

The spindle unit 5 includes a moving base plate 51, a spindle holder 52 secured to the moving base plate 51 with plural mounting bolts 5a, and a spindle housing 53 mounted on the spindle holder 52. The moving base plate 51 has two to-be-guided rails 51a and 51a that slidably fit to two guide rails 432a and 432a provided on the spindle-mounting portion 432 of the spindle support mechanism 4, and is so supported as to move in the direction indicated by the arrow Z by fitting the to-be-guided rails 51a and 51a to the guide rails 432a and 432a. A cutting blade 54 is rotatably attached to an end of the spindle housing 53. As shown in FIG. 3, the cutting blade 54 is mounted to a rotary spindle 56 that is rotatively driven by a rotary drive mechanism which is not shown. The cutting blade 54 includes an annular base plate 541 and an annular cutting edge 542 provided along the outer periphery of the base plate 541, and is mounted being sandwiched between a fixing flange (not shown) and a holding flange 58 by fitting the cutting blade 54 to a tool-mounting portion of the fixing flange attached to the end of the rotary spindle 56 and then, screwing the holding flange 58 onto the tool-mounting portion of the fixing flange. The spindle unit 5 includes a drive means 55 for moving the moving base plate 51 in the direction indicated by the arrow Z along the two guide rails 432a and 432a. Like the above-mentioned drive means 34 and 44, the drive means 55 includes an externally threaded rod (not shown) disposed between the two guide rails 432a and 432a, and a drive source such as pulse motor 552 for rotatively driving the externally threaded rod. By driving the externally threaded rod (not shown) forward and reverse by the pulse motor 552, the spindle unit 5 is moved along the guide rails 432a and 432a in the direction indicated by the arrow Z.

As shown in FIG. 1, the illustrated dicing machine includes a cassette 12 for stocking the semiconductor wafers 11 that are the workpieces to be treated, a workpiece delivery means 13, a workpiece conveyer means 14, a washing means 15, a wash/convey means 16, and an aligning means 17 constituted by a microscope, a CCD camera or the like. The semiconductor wafer 11 is mounted on a frame 111 using a tape 112, and is accommodated in the cassette 12 in a state of being mounted on the frame 111. Further, the cassette 12 is placed on a cassette table 121 that is so disposed as to move up and down by an ascending/descending means that is not shown.

Next, the processing action of the above-mentioned dicing machine will be briefly described.

The semiconductor wafer 11 in a state of being mounted on the frame 111 accommodated at a predetermined position in the cassette 12 (hereinafter, the semiconductor wafer 11 in a state of being mounted on the frame 111 is simply referred to as semiconductor wafer 11), is brought to a delivery position as the cassette table 121 is moved up and down by the ascending/descending means that is not shown. Next, the workpiece delivery means 13 moves back and forth to deliver the semiconductor wafer 11 located at the delivery position to a workpiece-placing area 18. The semiconductor wafer 11 delivered to the workpiece-placing area 18 is conveyed onto the adsorption chuck 332 of the chuck table 33 constituting the above-mentioned chuck table mechanism 3 by the turning action of the workpiece conveyer means 14, and is sucked and held by the adsorption chuck 332. The chuck table 33 that has held the semiconductor wafer 11 by suction, is then moved to just under the aligning means 17 along the guide rails 32 and 32. When the chuck table 33 is brought to just under the aligning means 17, a cutting line formed on the semiconductor wafer 11 is detected by the aligning means 17, and a precision positioning operation is executed. Thereafter, the chuck table 33 holding the semiconductor wafer 11 by suction is moved in the direction indicated by the arrow X which is the feeding direction (direction at right angles to the rotary shaft of the cutting blade 54), whereby the semiconductor wafer 11 held by the chuck table 33 is cut along a predetermined cutting line by the cutting edge 542 having a thickness of about 20 $\mu$m of the cutting blade 54. That is, the cutting blade 54 is mounted on the spindle unit 5 that is positioned by being moved and adjusted by its movement in the direction indicated by the arrow Y which is the indexing direction and in the direction indicated by the arrow Z which is the cutting-in direction, and rotatively driven. By moving the chuck table 33 in the feeding direction along the lower side of the cutting blade 54, therefore, the semiconductor wafer 11 held by the chuck table 33 is cut by the cutting edge 542 of the cutting blade 54 along the predetermined cutting line, and is divided into semiconductor chips. The semiconductor chips that have been cut do not scatter into pieces due to the action of the tape 112 but remain in the state of the semiconductor wafer 11 mounted on the frame 111. After the semiconductor wafer 11 is cut as described above, the chuck table 33 holding the semiconductor wafer 11 is returned back to the position where it has first held the semiconductor wafer 11 by suction and discontinues the holding of the semiconductor wafer 11 by suction. Then, the semiconductor wafer 11 is conveyed by the wash/convey means 16 to the washing means 15 and is washed. The thus washed semiconductor wafer 11 is delivered by the workpiece conveyer means 14 onto the workpiece-placing area 18. The semiconductor wafer 11 is then accommodated at a predetermined position in the cassette 12 by the workpiece delivery means 13.

Figure 4:
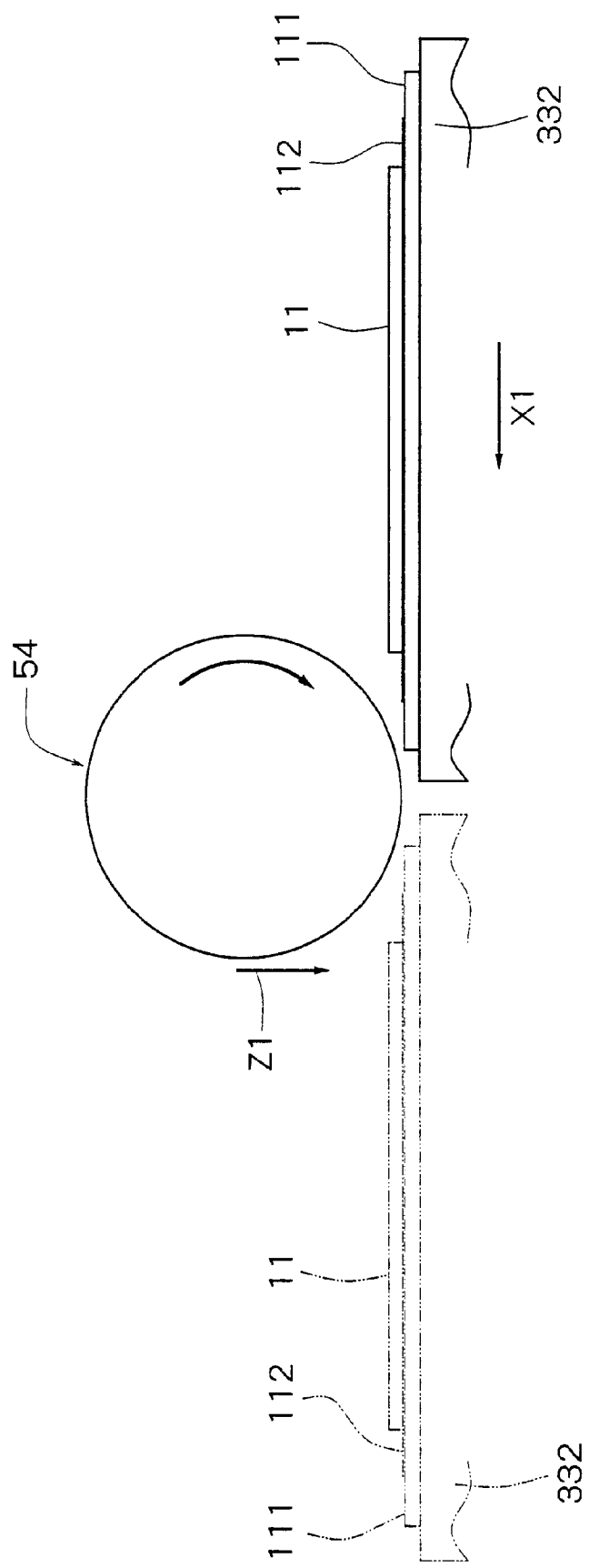
FIG. 4 is a view illustrating the cutting step in the cutting method according to the present invention.
Figure 5:
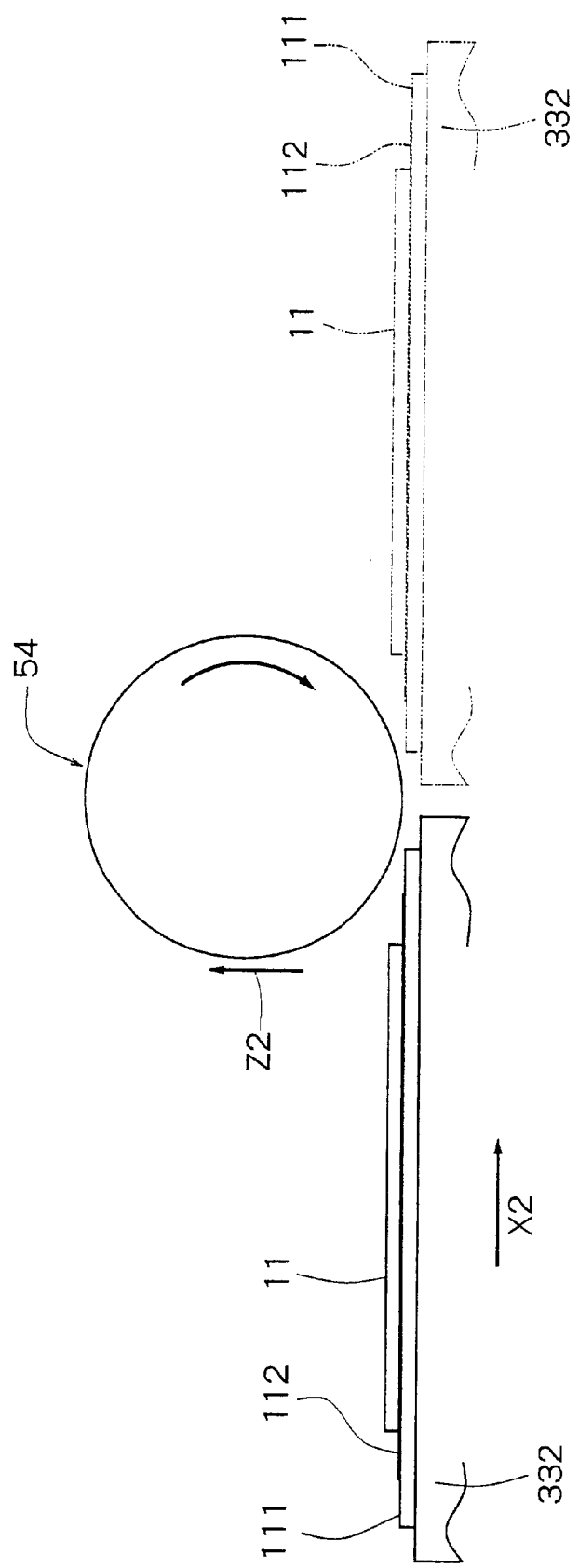
FIG. 5 is a view illustrating the burr-trimming step in the cutting method according to the present invention.

Next, described below with reference to FIGS. 4 and 5 is a method of cutting the semiconductor wafer on which the copper foil is laminated, by using the above-mentioned dicing machine.

The cutting method according to the present invention comprises a cutting step and a burr-trimming step. First, the cutting step will be described with reference to FIG. 4.

Figure 6:
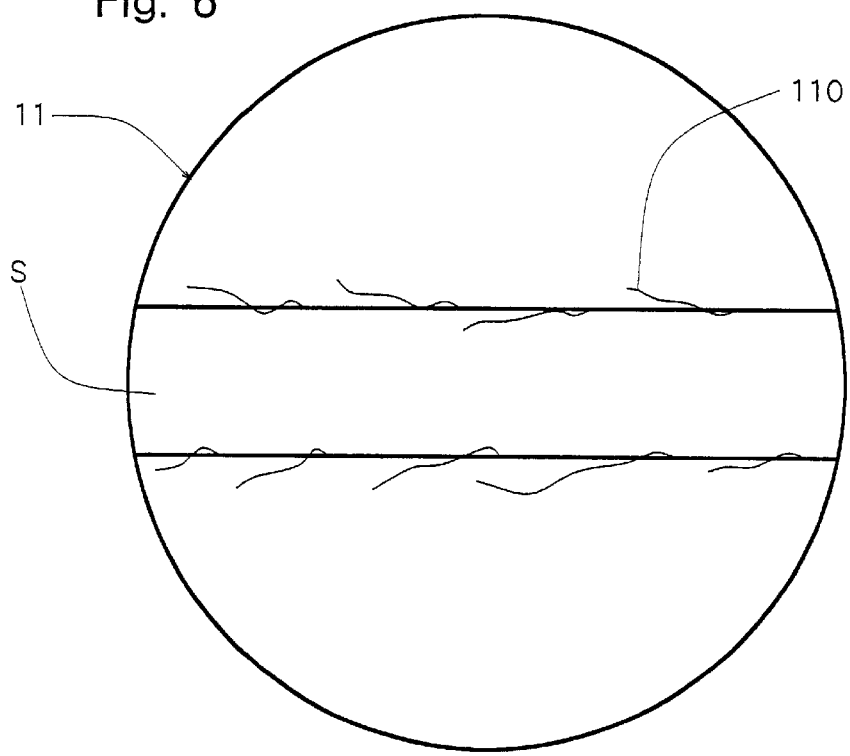
FIG. 6 is a view illustrating, in cross section and on an enlarged scale, the workpiece cut through the cutting step in the cutting method of the present invention.

In the cutting step, the cutting blade 54 is moved in the direction indicated by the arrow Y which is the indexing position (see FIG. 2) and is moved and adjusted to be positioned. Then, when a thickness to be cut of the semiconductor wafer 11 is, for example, 100 $\mu$m, the cutting blade 54 is moved and adjusted in the direction of an arrow Z1 which is the cutting-in direction such that the height of the cutting blade 54 (height of the lowest point of the cutting blade 54) is cut in by a depth of 100 $\mu$m plus a from the upper surface of the semiconductor wafer 11, so that the cutting blade 54 is positioned to be in slight contact with the tape 112. The chuck table 33, i.e., the semiconductor wafer 11 is moved, while rotating the cutting blade 54 in the direction indicated by an arrow in FIG. 4 at a rotational speed of, for example, 30,000 rpm, in the feeding direction indicated by an arrow X1 which accords with the rotational direction of the cutting blade 54 at a moving speed of 60 mm/sec up to a cutting finish position indicated by a two-dot chain line in FIG. 4, thereby to cut the semiconductor wafer 11 along a predetermined cutting line. In this cutting step, the relationship between the rotational direction of the cutting blade 54 and the feeding direction of the semiconductor wafer 11 is such that the wafer 11 is moved in the forward direction in respect to the rotational direction of the cutting blade 54 at a position where the cutting blade 54 and the semiconductor wafer 11 which is a workpiece face each other. The cutting step is substantially the same as that of the conventional cutting. Plural whisker-like burrs 110 having lengths of about 20 to 50 $\mu$m are formed on both cut surfaces of the groove S cut in the semiconductor wafer 11, as shown in FIG. 6. The burrs 110 are formed when the copper foil laminated on the semiconductor wafer 11 is cut by the cutting blade 54. The cutting method according to the present invention includes a burr-trimming step for removing the burrs 110 produced in the cutting step.

Next, the burr-trimming step will be described with reference to FIG. 5.

According to the conventional cutting method, the cutting blade 54 is pulled up after the cutting step has finished, as described above. Thereafter, the chuck table 33, i.e., the semiconductor wafer 11 is returned to a position indicated by a solid line in FIG. 4 and then, the cutting blade 54 is indexed by a predetermined amount in the Y-axis direction to repeat the above-mentioned cutting step. According to the cutting method of the present invention, however, the burr-trimming step is further executed.

Figure 7:
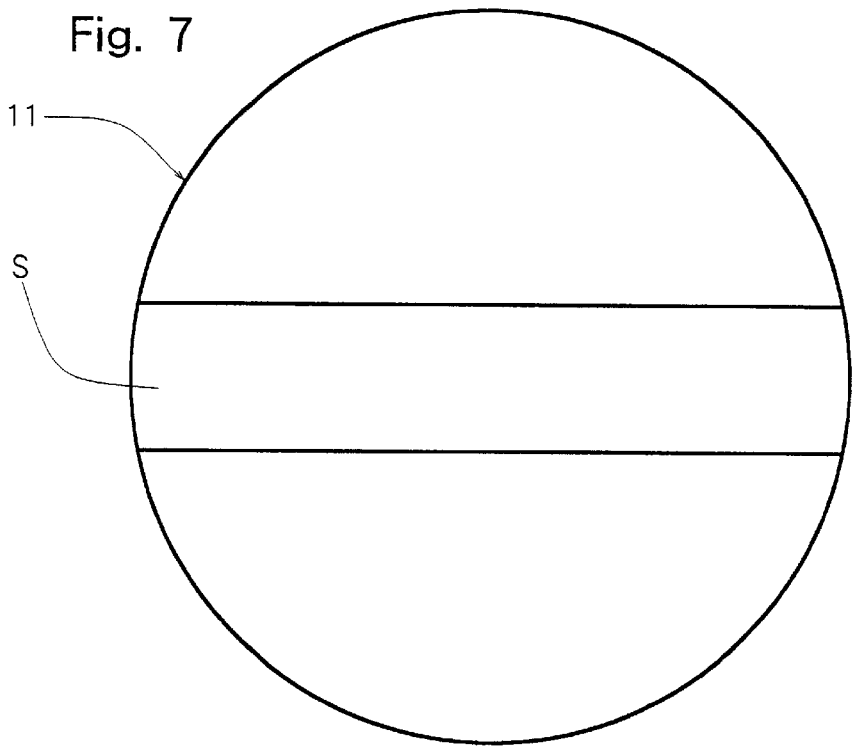
FIG. 7 is a view illustrating, in cross section and on an enlarged scale, the workpiece after the burr-trimming step in the cutting method of the present invention.

In the burr-trimming step, after the cutting step has finished as described above and the semiconductor wafer 11 is brought to the cutting finish position (position indicated by a two-dot chain line in FIG. 4 and a position indicated by a solid line in FIG. 5), the semiconductor wafer 11 is moved in the feeding direction indicated by an arrow X2, which is against the rotational direction of the cutting blade 54 from the position indicated by the solid line in FIG. 5, in order to trace the groove cut by the above-mentioned cutting step. In this case, the rotational direction of the cutting blade 54 is the same as that in the above-mentioned cutting step. Therefore, the relationship between the rotational direction of the cutting blade 54 and the direction of feeding the semiconductor wafer 11 is such that the semiconductor wafer 11 is fed in a direction opposite to the rotational direction of the cutting blade 54 at a position where the cutting blade 54 and the semiconductor wafer 11 which is a workpiece face each other. At this instance, it is desired that the speed of moving the semiconductor wafer 11 in the direction indicated by the arrow X2 in the burr-trimming step is greater than the speed of moving the semiconductor wafer 11 in the direction indicated by the arrow X1 in the cutting step. In the illustrated embodiment, the speed of moving the semiconductor wafer 11 in the burr-trimming step is set to be 120 mm/sec. Further, the cutting blade 54 may be slightly raised in the direction indicated by Z2 when the semiconductor wafer 11 is moved in the direction indicated by the arrow X2. Thus, the semiconductor wafer 11 is moved from the position indicated by the solid line to the start position indicated by the two-dot chain line in FIG. 5, whereby the burr-trimming step is completed. By tracing the groove cut by the cutting step with the cutting blade 54 in the burr-trimming step, the whisker-like burrs 110 that have formed on both sides of the groove S cut by the cutting step are removed as shown in FIG. 7. According to experiment conducted by the present inventor, favorable results were obtained under the cutting conditions in which the rotational speed of the cutting blade 54 was 20,000 to 35,000 rpm, particularly, 30,000 rpm, the speed of feeding the semiconductor wafer 11 was 10 to 60 mm/sec, particularly, 60 mm/sec in the cutting step, and the speed of feeding the semiconductor wafer 11 was 60 to 120 mm/sec, particularly, 120 mm/sec in the burr-trimming step.

Figure 8:
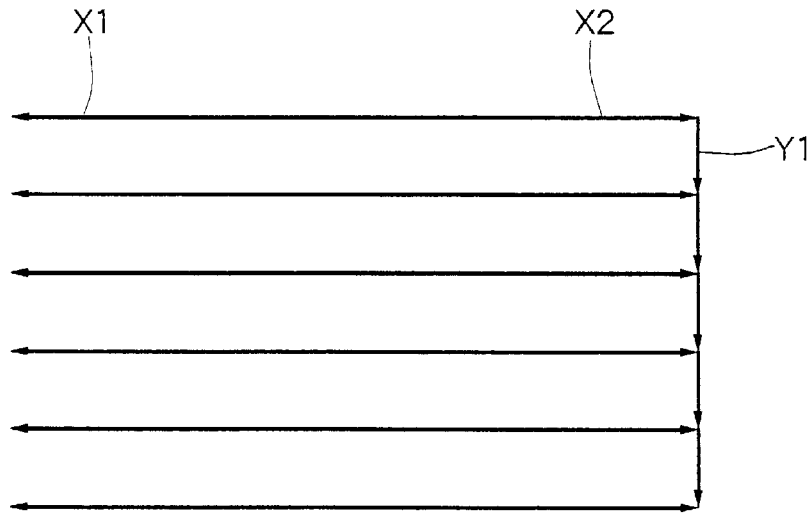
FIG. 8 is a view illustrating the movement of the workpiece and the cutting blade in an embodiment of the cutting method of the present invention.

After the burr-trimming step is finished as described above, the cutting blade 54 is fed for indexing a cutting line that is to be cut next (in the direction of the arrow Y in FIG. 2) and is also fed for cutting (direction of the arrow Z1 in FIG. 2) and then, the above-mentioned cutting step and burr-trimming step are repeatedly carried out to execute the cutting along plural cutting lines formed on the semiconductor wafer 11. FIG. 8 illustrates the movement of the chuck table 33, i.e., the semiconductor wafer 11 in the direction of the arrow X which is the feeding direction and the movement of the cutting blade 54 in the direction of the arrow Y which is the indexing direction after the cutting blade 54 is moved and adjusted in the direction indicated by the arrow Z1 which is the cutting-in direction. That is, after the cutting-in amount of the cutting blade 54 is adjusted, the chuck table 33 or the semiconductor wafer 11 is moved in the direction indicated by the arrow X1 to execute the cutting step. Then, the chuck table 33 or the semiconductor wafer 11 is moved in the direction indicated by the arrow X2 to execute the burr-trimming step. After the burr-trimming step has finished, the cutting blade 54 is moved and adjusted in the direction of the arrow Y1 which is the indexing direction, and the above-mentioned cutting step and burr-trimming step are successively executed. When the cutting blade 54 is slightly raised in the direction Z2 in the burr-trimming step, there must be added a step of moving and adjusting the cutting blade 54 in the direction Z2 after the finish of the cutting step.

Figure 9:
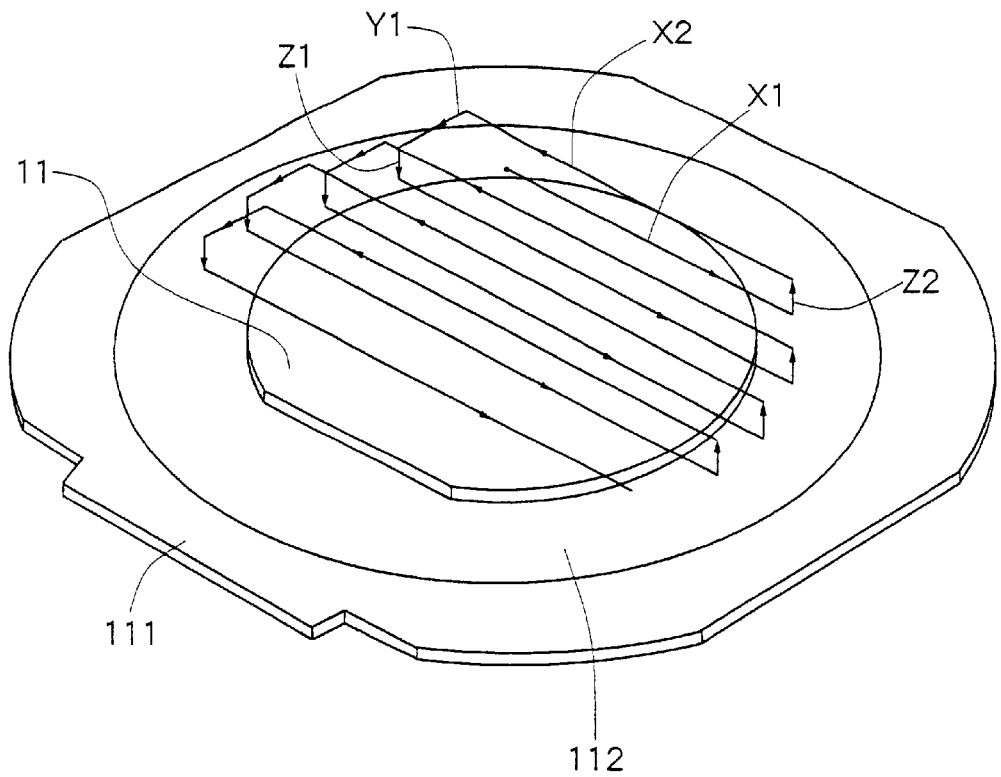
FIG. 9 is a view illustrating the movement of the cutting blade according to another embodiment of the cutting method of the present invention.

In the above-mentioned embodiment, the chuck table 33 or the semiconductor wafer 11 was fed for cutting (i.e., fed in the direction of the arrow X). However, the cutting blade 54 itself may be fed for cutting. Here, the movement of the cutting blade 54 inclusive of a step of moving and adjusting the cutting blade 54 in the direction of Z2 after finish of the cutting step, will be described with reference to FIG. 9. The cutting blade 54 is moved and adjusted in the direction indicated by the arrow Z1 which is the cutting-in direction, and is then moved in the direction indicated by the arrow Xl to execute the cutting step. Then, the cutting blade 54 is moved and adjusted in the direction of Z2 up to a position where the outer circumferential edge of the cutting edge 542 comes into contact with the copper foil which is the lowermost layer laminated on the semiconductor wafer 11 and then, the cutting blade 54 is moved in the direction indicated by the arrow X2 to execute the burr-trimming step. After the burr-trimming step is finished, the cutting blade 54 is moved and adjusted in the direction indicated by the arrow Y1 which is the indexing direction and is further moved and adjusted in the direction indicated by the arrow Z1 which is the cutting-in direction, to execute the cutting step and the burr-trimming step successively.

Though the above-mentioned embodiment has dealt with the semiconductor wafer on which the copper foil is laminated as a workpiece to be treated, the cutting method of the present invention can be effectively applied also to the workpieces on which a gold layer or a silver layer is laminated and which may cause the same problem as that of the copper foil. Further, the cutting method of the invention can be effectively utilized not only for the semiconductor wafers but also for such workpieces as ceramics, ferrite, glass, heat-sinking material and micro-lead package (quad flat non-lead package) packaging a semiconductor on which a copper or the like is laminated.

Being constituted as described above, the cutting method of the present invention exhibits the action and effect as described below.

That is, the present invention includes the cutting step and the burr-trimming step for tracing the groove cut by the cutting step and hence, makes it possible to remove burrs formed by the cutting step. In particular, by setting the relative speed between the cutting blade and the workpiece in the burr-trimming step to be greater than the relative speed between the cutting blade and the workpiece in the cutting step, the burrs formed in the cutting step can be reliably removed.

What is claimed is:

1. A cutting method of cutting a workpiece by moving said workpiece relatively to a cutting blade that has an annular cutting edge and rotates in a predetermined direction, said workpiece being moved in a direction at right angles to the rotary shaft of said cutting blade, wherein said workpiece has a tape disposed on an undersurface thereof and is mounted and secured to a frame using said tape, wherein said cutting method comprises:

a cutting step of cutting said workpiece comprising positioning the blade so that the blade is in slight contact with the tape, moving said workpiece in a forward direction in respect to the rotational direction of said cutting blade at a position where said blade and said workpiece face each other, and cutting the workpiece over its full thickness; and a burr-trimming step for tracing the groove cut by said cutting step so as to remove burrs formed in said cutting step, comprising moving said workpiece in a direction against the rotational direction of said cutting blade at a position where said blade and said workpiece face each other.

2. A cutting method according to claim 1, wherein said cutting step and said burr-trimming step are successively executed by reciprocatingly moving said workpiece relative to said cutting blade that rotates in the predetermined direction, said cutting blade is fed for indexing a cutting line that is to be cut next, and said cutting step and said burr-trimming step are successively executed by reciprocatingly moving said workpiece.

3. A cutting method according to claim 1, wherein a relative moving speed between said cutting blade and said workpiece in said burr-trimming step is set to be greater than a relative moving speed between said cutting blade and said workpiece in said cutting step.

4. A cutting method according to claim 2, wherein a relative moving speed between said cutting blade and said workpiece in said burr-trimming step is set to be greater than a relative moving speed between said cutting blade and said workpiece in said cutting step.

5. A cutting method of cutting a workpiece by moving said workpiece relatively to a cutting blade that has an annular cutting edge and rotates in a predetermined direction, said workpiece being moved in a direction at right angles to the rotary shaft of said cutting blade, wherein said cutting method comprises:

a cutting step of cutting said workpiece comprising moving said workpiece in a forward direction in respect to the rotational direction of said cutting blade at a position where said blade and said workpiece face each other; and a burr-trimming step for tracing the groove cut by said cutting step comprising moving said workpiece in a direction against the rotational direction of said cutting blade at a position where said blade and said workpiece face each other, wherein a relative moving speed between said cutting blade and said workpiece in said burr-trimming step is set to be greater than a relative moving speed between said cutting blade and said workpiece in said cutting step.

6. A cutting method according to claim 5, wherein said cutting step and said burr-trimming step are successively executed by reciprocatingly moving said workpiece relative to said cutting blade that rotates in the predetermined direction, said cutting blade is fed for indexing a cutting line that is to be cut next, and said cutting step and said burr-trimming step are successively executed by reciprocatingly moving said workpiece.

* * * * *